US009910189B2

(12) United States Patent
Dickens

(10) Patent No.: US 9,910,189 B2
(45) Date of Patent: Mar. 6, 2018

(54) METHOD FOR FAST LINE SEARCH IN FREQUENCY DOMAIN FWI

(71) Applicant: Thomas A. Dickens, Houston, TX (US)

(72) Inventor: Thomas A. Dickens, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 440 days.

(21) Appl. No.: 14/657,962

(22) Filed: Mar. 13, 2015

(65) Prior Publication Data

US 2015/0293261 A1   Oct. 15, 2015

Related U.S. Application Data

(60) Provisional application No. 61/977,416, filed on Apr. 9, 2014.

(51) Int. Cl.
G06G 7/48 (2006.01)
G01V 99/00 (2009.01)
G06F 17/12 (2006.01)
G06F 17/50 (2006.01)

(52) U.S. Cl.
CPC .............. G01V 99/00 (2013.01); G06F 17/12 (2013.01); G06F 17/5009 (2013.01)

(58) Field of Classification Search
None
See application file for complete search history.

(56) References Cited

U.S. PATENT DOCUMENTS

| 3,812,457 | A | 5/1974 | Weller |
|---|---|---|---|
| 3,864,667 | A | 2/1975 | Bahjat |
| 4,159,463 | A | 6/1979 | Silverman |
| 4,168,485 | A | 9/1979 | Payton et al. |
| 4,545,039 | A | 10/1985 | Savit |
| 4,562,650 | A | 1/1986 | Nagasawa et al. |
| 4,575,830 | A | 3/1986 | Ingram et al. |

(Continued)

FOREIGN PATENT DOCUMENTS

| CA | 2 796 631 | 11/2011 |
|---|---|---|
| EP | 1 094 338 | 4/2001 |

(Continued)

OTHER PUBLICATIONS

Kwak, Sangmin et al., "Frequency-Domain Homotopy Inversion Using the Perturbation Theory", 2011, SEG San Antonio Annual Meeting, SEG.*

(Continued)

Primary Examiner — Cedric Johnson
(74) Attorney, Agent, or Firm — ExxonMobil Upstream Research Company Law Department

(57) ABSTRACT

Method for rapidly computing updates to frequency-domain seismic wave fields by utilizing a matrix perturbation approach. The method speeds up model (e.g., velocity) parameter estimation by iterative inversion of measured seismic data. The method applies to the line search where the optimal size of the model update is estimated by testing different size updates to see which one generates the minimum objective function. By treating the model update as a perturbation, perturbation theory is used to relate the model perturbation to a corresponding wavefield perturbation. Thus, the Helmholtz equation is solved only once per iteration cycle.

8 Claims, 7 Drawing Sheets

(56) References Cited

U.S. PATENT DOCUMENTS

| | | |
|---|---|---|
| 4,594,662 A | 6/1986 | Devaney |
| 4,636,957 A | 1/1987 | Vannier et al. |
| 4,675,851 A | 6/1987 | Savit et al. |
| 4,686,654 A | 8/1987 | Savit |
| 4,707,812 A | 11/1987 | Martinez |
| 4,715,020 A | 12/1987 | Landrum, Jr. |
| 4,766,574 A | 8/1988 | Whitmore et al. |
| 4,780,856 A | 10/1988 | Becquey |
| 4,823,326 A | 4/1989 | Ward |
| 4,924,390 A | 5/1990 | Parsons et al. |
| 4,953,657 A | 9/1990 | Edington |
| 4,969,129 A | 11/1990 | Currie |
| 4,982,374 A | 1/1991 | Edington et al. |
| 5,260,911 A | 11/1993 | Mason et al. |
| 5,469,062 A | 11/1995 | Meyer, Jr. |
| 5,583,825 A | 12/1996 | Carrazzone et al. |
| 5,677,893 A | 10/1997 | de Hoop et al. |
| 5,715,213 A | 2/1998 | Allen |
| 5,717,655 A | 2/1998 | Beasley |
| 5,719,821 A | 2/1998 | Sallas et al. |
| 5,721,710 A | 2/1998 | Sallas et al. |
| 5,790,473 A | 8/1998 | Allen |
| 5,798,982 A | 8/1998 | He et al. |
| 5,822,269 A | 10/1998 | Allen |
| 5,838,634 A | 11/1998 | Jones et al. |
| 5,852,588 A | 12/1998 | de Hoop et al. |
| 5,878,372 A | 3/1999 | Tabarovsky et al. |
| 5,920,838 A | 7/1999 | Norris et al. |
| 5,924,049 A | 7/1999 | Beasley et al. |
| 5,999,488 A | 12/1999 | Smith |
| 5,999,489 A | 12/1999 | Lazaratos |
| 6,014,342 A | 1/2000 | Lazaratos |
| 6,021,094 A | 2/2000 | Ober et al. |
| 6,028,818 A | 2/2000 | Jeffryes |
| 6,058,073 A | 5/2000 | VerWest |
| 6,125,330 A | 9/2000 | Robertson et al. |
| 6,219,621 B1 | 4/2001 | Hornbostel |
| 6,225,803 B1 | 5/2001 | Chen |
| 6,311,133 B1 | 10/2001 | Lailly et al. |
| 6,317,695 B1 | 11/2001 | Zhou et al. |
| 6,327,537 B1 | 12/2001 | Ikelle |
| 6,374,201 B1 | 4/2002 | Grizon et al. |
| 6,381,543 B1 | 4/2002 | Guerillot et al. |
| 6,388,947 B1 | 5/2002 | Washbourne et al. |
| 6,480,790 B1 | 11/2002 | Calvert et al. |
| 6,522,973 B1 | 2/2003 | Tonellot et al. |
| 6,545,944 B2 | 4/2003 | de Kok |
| 6,549,854 B1 | 4/2003 | Malinverno et al. |
| 6,574,564 B2 | 6/2003 | Lailly et al. |
| 6,593,746 B2 | 7/2003 | Stolarczyk |
| 6,662,147 B1 | 12/2003 | Fournier et al. |
| 6,665,615 B2 | 12/2003 | Van Riel et al. |
| 6,687,619 B2 | 2/2004 | Moerig et al. |
| 6,687,659 B1 | 2/2004 | Shen |
| 6,704,245 B2 | 3/2004 | Becquey |
| 6,714,867 B2 | 3/2004 | Meunier |
| 6,735,527 B1 | 5/2004 | Levin |
| 6,754,590 B1 | 6/2004 | Moldoveanu |
| 6,766,256 B2 | 7/2004 | Jeffryes |
| 6,826,486 B1 | 11/2004 | Malinverno |
| 6,836,448 B2 | 12/2004 | Robertsson et al. |
| 6,842,701 B2 | 1/2005 | Moerig et al. |
| 6,859,734 B2 | 2/2005 | Bednar |
| 6,865,487 B2 | 3/2005 | Charron |
| 6,865,488 B2 | 3/2005 | Moerig et al. |
| 6,876,928 B2 | 4/2005 | Van Riel et al. |
| 6,882,938 B2 | 4/2005 | Vaage et al. |
| 6,882,958 B2 | 4/2005 | Schmidt et al. |
| 6,901,333 B2 | 5/2005 | Van Riel et al. |
| 6,903,999 B2 | 6/2005 | Curtis et al. |
| 6,905,916 B2 | 6/2005 | Bartsch et al. |
| 6,906,981 B2 | 6/2005 | Vauge |
| 6,927,698 B2 | 8/2005 | Stolarczyk |
| 6,944,546 B2 | 9/2005 | Xiao et al. |
| 6,947,843 B2 | 9/2005 | Fisher et al. |
| 6,970,397 B2 | 11/2005 | Castagna et al. |
| 6,977,866 B2 | 12/2005 | Huffman et al. |
| 6,999,880 B2 | 2/2006 | Lee |
| 7,046,581 B2 | 5/2006 | Calvert |
| 7,050,356 B2 | 5/2006 | Jeffryes |
| 7,069,149 B2 | 6/2006 | Goff et al. |
| 7,027,927 B2 | 7/2006 | Routh et al. |
| 7,072,767 B2 | 7/2006 | Routh et al. |
| 7,092,823 B2 | 8/2006 | Lailly et al. |
| 7,110,900 B2 | 9/2006 | Adler et al. |
| 7,184,367 B2 | 2/2007 | Yin |
| 7,230,879 B2 | 6/2007 | Herkenoff et al. |
| 7,271,747 B2 | 9/2007 | Baraniuk et al. |
| 7,330,799 B2 | 2/2008 | Lefebvre et al. |
| 7,337,069 B2 | 2/2008 | Masson et al. |
| 7,373,251 B2 | 5/2008 | Hamman et al. |
| 7,373,252 B2 | 5/2008 | Sherrill et al. |
| 7,376,046 B2 | 5/2008 | Jeffryes |
| 7,376,539 B2 | 5/2008 | Lecomte |
| 7,400,978 B2 | 7/2008 | Langlais et al. |
| 7,436,734 B2 | 10/2008 | Krohn |
| 7,480,206 B2 | 1/2009 | Hill |
| 7,584,056 B2 | 9/2009 | Koren |
| 7,599,798 B2 | 10/2009 | Beasley et al. |
| 7,602,670 B2 | 10/2009 | Jeffryes |
| 7,616,523 B1 | 11/2009 | Tabti et al. |
| 7,620,534 B2 | 11/2009 | Pita et al. |
| 7,620,536 B2 | 11/2009 | Chow |
| 7,646,924 B2 | 1/2010 | Donoho |
| 7,672,194 B2 | 3/2010 | Jeffryes |
| 7,672,824 B2 | 3/2010 | Dutta et al. |
| 7,675,815 B2 | 3/2010 | Saenger et al. |
| 7,679,990 B2 | 3/2010 | Herkenhoff et al. |
| 7,684,281 B2 | 3/2010 | Vaage et al. |
| 7,710,821 B2 | 5/2010 | Robertsson et al. |
| 7,715,985 B2 | 5/2010 | Van Manen et al. |
| 7,715,986 B2 | 5/2010 | Nemeth et al. |
| 7,725,266 B2 | 5/2010 | Sirgue et al. |
| 7,791,980 B2 | 9/2010 | Robertsson et al. |
| 7,835,072 B2 | 11/2010 | Izumi |
| 7,840,625 B2 | 11/2010 | Candes et al. |
| 7,940,601 B2 | 5/2011 | Ghosh |
| 8,121,823 B2 | 2/2012 | Krebs et al. |
| 8,248,886 B2 | 8/2012 | Neelamani et al. |
| 8,428,925 B2 | 4/2013 | Krebs et al. |
| 8,437,998 B2 | 5/2013 | Routh et al. |
| 8,547,794 B2 | 10/2013 | Gulati et al. |
| 8,688,381 B2 | 4/2014 | Routh et al. |
| 8,781,748 B2 | 7/2014 | Laddoch et al. |
| 2002/0099504 A1 | 7/2002 | Cross et al. |
| 2002/0120429 A1 | 8/2002 | Ortoleva |
| 2002/0183980 A1 | 12/2002 | Guillaume |
| 2004/0199330 A1 | 10/2004 | Routh et al. |
| 2004/0225438 A1 | 11/2004 | Okoniewski et al. |
| 2006/0235666 A1 | 10/2006 | Assa et al. |
| 2007/0036030 A1 | 2/2007 | Baumel et al. |
| 2007/0038691 A1 | 2/2007 | Candes et al. |
| 2007/0274155 A1 | 11/2007 | Ikelle |
| 2008/0175101 A1 | 7/2008 | Saenger et al. |
| 2008/0306692 A1 | 12/2008 | Singer et al. |
| 2009/0006054 A1 | 1/2009 | Song |
| 2009/0067041 A1 | 3/2009 | Krauklis et al. |
| 2009/0070042 A1 | 3/2009 | Birchwood et al. |
| 2009/0083006 A1 | 3/2009 | Mackie |
| 2009/0164186 A1 | 6/2009 | Haase et al. |
| 2009/0164756 A1 | 6/2009 | Dokken et al. |
| 2009/0187391 A1 | 7/2009 | Wendt et al. |
| 2009/0248308 A1 | 10/2009 | Luling |
| 2009/0254320 A1 | 10/2009 | Lovatini et al. |
| 2009/0259406 A1 | 10/2009 | Khadhraoui et al. |
| 2010/0008184 A1 | 1/2010 | Hegna et al. |
| 2010/0018718 A1 | 1/2010 | Krebs et al. |
| 2010/0039894 A1 | 2/2010 | Abma et al. |
| 2010/0054082 A1 | 3/2010 | McGarry et al. |
| 2010/0088035 A1 | 4/2010 | Etgen et al. |
| 2010/0103772 A1 | 4/2010 | Eick et al. |
| 2010/0118651 A1 | 5/2010 | Liu et al. |
| 2010/0142316 A1 | 6/2010 | Keers et al. |
| 2010/0161233 A1 | 6/2010 | Saenger et al. |

(56) References Cited

U.S. PATENT DOCUMENTS

| | | |
|---|---|---|
| 2010/0161234 A1 | 6/2010 | Saenger et al. |
| 2010/0185422 A1 | 7/2010 | Hoversten |
| 2010/0208554 A1 | 8/2010 | Chiu et al. |
| 2010/0212902 A1 | 8/2010 | Baumstein et al. |
| 2010/0246324 A1 | 9/2010 | Dragoset, Jr. et al. |
| 2010/0265797 A1 | 10/2010 | Robertsson et al. |
| 2010/0270026 A1 | 10/2010 | Lazaratos et al. |
| 2010/0286919 A1 | 11/2010 | Lee et al. |
| 2010/0299070 A1 | 11/2010 | Abma |
| 2011/0000678 A1 | 1/2011 | Krebs et al. |
| 2011/0040926 A1 | 2/2011 | Donderici et al. |
| 2011/0051553 A1 | 3/2011 | Scott et al. |
| 2011/0054859 A1* | 3/2011 | Ding ............... E21B 43/20 703/2 |
| 2011/0090760 A1 | 4/2011 | Rickett et al. |
| 2011/0131020 A1 | 6/2011 | Meng |
| 2011/0134722 A1 | 6/2011 | Virgilio et al. |
| 2011/0182141 A1 | 7/2011 | Zhamikov et al. |
| 2011/0182144 A1 | 7/2011 | Gray |
| 2011/0191032 A1 | 8/2011 | Moore |
| 2011/0194379 A1 | 8/2011 | Lee et al. |
| 2011/0222370 A1 | 9/2011 | Downton et al. |
| 2011/0227577 A1 | 9/2011 | Zhang et al. |
| 2011/0235464 A1 | 9/2011 | Brittan et al. |
| 2011/0238390 A1* | 9/2011 | Krebs ............... G01V 1/282 703/2 |
| 2011/0246140 A1 | 10/2011 | Abubakar et al. |
| 2011/0267921 A1 | 11/2011 | Mortel et al. |
| 2011/0267923 A1 | 11/2011 | Shin |
| 2011/0276320 A1* | 11/2011 | Krebs ............... G01V 11/00 703/6 |
| 2011/0288831 A1 | 11/2011 | Tan et al. |
| 2011/0299361 A1 | 12/2011 | Shin |
| 2011/0320180 A1 | 12/2011 | Al-Saleh |
| 2012/0010862 A1 | 1/2012 | Costen |
| 2012/0014215 A1 | 1/2012 | Saenger et al. |
| 2012/0014216 A1 | 1/2012 | Saenger et al. |
| 2012/0051176 A1 | 3/2012 | Liu |
| 2012/0073824 A1 | 3/2012 | Routh |
| 2012/0073825 A1 | 3/2012 | Routh |
| 2012/0082344 A1 | 4/2012 | Donoho |
| 2012/0143506 A1 | 6/2012 | Routh et al. |
| 2012/0215506 A1 | 8/2012 | Rickett et al. |
| 2012/0218859 A1 | 8/2012 | Soubaras |
| 2012/0275264 A1 | 11/2012 | Kostov et al. |
| 2012/0275267 A1 | 11/2012 | Neelamani et al. |
| 2012/0290214 A1 | 11/2012 | Huo et al. |
| 2012/0314538 A1 | 12/2012 | Washbourne et al. |
| 2012/0316790 A1* | 12/2012 | Washbourne ...... G01V 1/307 702/14 |
| 2012/0316844 A1 | 12/2012 | Shah et al. |
| 2013/0081752 A1 | 4/2013 | Kurimura et al. |
| 2013/0238246 A1 | 9/2013 | Krebs et al. |
| 2013/0279290 A1 | 10/2013 | Poole |
| 2013/0282292 A1 | 10/2013 | Wang et al. |
| 2013/0311149 A1 | 11/2013 | Tang |
| 2013/0311151 A1 | 11/2013 | Plessix |

FOREIGN PATENT DOCUMENTS

| | | |
|---|---|---|
| EP | 1 746 443 | 1/2007 |
| GB | 2 390 712 | 1/2004 |
| GB | 2 391 665 | 2/2004 |
| WO | WO 2006/037815 | 4/2006 |
| WO | WO 2007/046711 | 4/2007 |
| WO | WO 2008/042081 | 4/2008 |
| WO | WO 2008/123920 | 10/2008 |
| WO | WO 2009/067041 | 5/2009 |
| WO | WO 2009/117174 | 9/2009 |
| WO | WO 2010/085822 | 7/2010 |
| WO | WO 2011/040926 | 4/2011 |
| WO | WO 2011/091216 | 7/2011 |
| WO | WO 2011/093945 | 8/2011 |
| WO | WO 2012/024025 | 2/2012 |
| WO | WO 2012/041834 | 4/2012 |
| WO | WO 2012/083234 | 6/2012 |
| WO | WO 2012/134621 | 10/2012 |
| WO | WO 2012/170201 | 12/2012 |
| WO | WO 2013/081752 | 6/2013 |

OTHER PUBLICATIONS

Brossier, R. "Two-Dimensional Frequency-Domain Visco-Elastic Full Waveform Inversion: Parallel Algorithms, Optimization and Performance", Nov. 10, 2010, Computers & Geosciences 37, Elsevier Ltd. (Year: 2010).*

Asnaashari, Amir et al., "Sensitivity Analysis of Time-Lapse Images Obtained by Differential Waveform Inversion with Respect to Reference Model", 2011, SEG San Antonio Annual Meeting. (Year: 2011).*

U.S. Appl. No. 14/272,020, filed May 7, 2014, Wang et al.

U.S. Appl. No. 14/272,827, filed May 8, 2014, Baumstein et al.

U.S. Appl. No. 14/286,107, filed May 23, 2014, Hu et al.

U.S. Appl. No. 14/311,945, filed Jun. 20, 2014, Bansal et al.

U.S. Appl. No. 14/329,431, filed Jul. 11, 2014, Krohn et al.

U.S. Appl. No. 14/330,767, filed Jul. 14, 2014, Tang et al.

Fehler, M. et al. (2008), "SEG Advanced modeling (SEAM): Phase I first year update," *The Leading Edge* 27, pp. 1006-1007.

Higham, N. (1996), "Accuracy and Stability of Noermical Algorithms," Philadelphia: Society for Industrial and Applied Mathematics, Chapter 9, pp. 169-199.

Nocedel, J. (2006), "Numerical Optimization," Springer, Chapter 3, pp. 30-63.

Saad, Y. et al. (1986), "GMRES: A generalized minimal residual algorithm for solving nonsymmetric linear systems," *SIAM. J. Sci. Stat. Comput.* 7, pp. 856-869.

Shin, C. et al. (2011), "Frequency-domain homotopy inversion using the perturbation theory," SEG San Antonio 2011 Annual Meeting, pp. 2560-2564.

Shin, C. et al. (2013), "Application of frequency-domain homotopy inversion to real data," SEG Houston 2013 Annual Meeting, pp. 939-943.

Stewart, G.W. et al. (1990), "Matrix Perturbation Theory," Academic Press Inc., San Diego, Chapter 2, pp. 114-125.

Wang, S. et al. (2010), "Acoustic inverse scattering via Helmholtz operator factorization and optimization," *Journal of Computational Physics* 229, pp. 8445-8462.

Mora, P. (1987), "Elastic Wavefield Inversion," PhD Thesis, Stanford University, pp. 22-25.

Mora, P. (1989), "Inversion = migration + tomography," *Geophysics* 64, pp. 888-901.

Nazarian, S. et al. (1983), "Use of spectral analysis of surface waves method for determination of moduli and thickness of pavement systems," *Transport Res. Record* 930, pp. 38-45.

Neelamani, R., (2008), "Simultaneous sourcing without compromise," 70th Annual Int'l. Conf. and Exh., EAGE, 5 pgs.

Neelamani, R. (2009), "Efficient seismic forward modeling using simultaneous sources and sparsity," *SEG Expanded Abstracts*, pp. 2107-2111.

Nocedal, J. et al. (2006), "*Numerical Optimization, Chapt. 7—Large-Scale Unconstrained Optimization*," Springer, New York, $2^{nd}$ Edition, pp. 165-176.

Nocedal, J. et al. (2000), "Numerical Optimization-Calculating Derivatives," Chapter 8, Springer Verlag, pp. 194-199.

Ostmo, S. et al. (2002), "Finite-difference iterative migration by linearized waveform inversion in the frequency domain," SEG Int'l. Expo. & $72^{nd}$ Ann. Meeting, 4 pgs.

Park, C.B. et al. (1999), "Multichannel analysis of surface waves," *Geophysics* 64(3), pp. 800-808.

Park, C.B. et al. (2007), "Multichannel analysis of surface waves (MASW)—active and passive methods," *The Leading Edge*, pp. 60-64.

Pica, A. et al. (2005), "3D Surface-Related Multiple Modeling, Principles and Results," 2005 SEG Ann. Meeting, *SEG Expanded Abstracts* 24, pp. 2080-2083.

(56) References Cited

OTHER PUBLICATIONS

Plessix, R.E. et al. (2004), "Frequency-domain finite-difference amplitude preserving migration," *Geophys. J. Int.* 157, pp. 975-987.
Porter, R.P. (1989), "Generalized holography with application to inverse scattering and inverse source problems," In E. Wolf, editor. Progress in Optics XXVII, Elsevier, pp. 317-397.
Pratt, R.G. et al. (1998), "Gauss-Newton and full Newton methods in frequency-space seismic waveform inversion," *Geophys. J Int.* 133, pp. 341-362.
Pratt, R.G. (1999), "Seismic waveform inversion in the frequency domain, Part 1: Theory and verification in a physical scale model," *Geophysics* 64, pp. 888-901.
Rawlinson, N. et al. (2008), "A dynamic objective function technique for generating multiple solution models in seismic tomography," *Geophys. J. Int.* 178, pp. 295-308.
Rayleigh, J.W.S. (1899), "On the transmission of light through an atmosphere containing small particles in suspension, and on the origin of the blue of the sky," Phil. Mag. 47, pp. 375-384.
Romero, L.A. et al. (2000), Phase encoding of shot records in prestack migration, *Geophysics* 65, pp. 426-436.
Ronen S. et al. (2005), "Imaging Downgoing waves from Ocean Bottom Stations," *SEG Expanded Abstracts*, pp. 963-967.
Routh, P. et al. (2011), "Encoded Simultaneous Source Full-Wavefield Inversion for Spectrally-Shaped Marine Streamer Data," SEG San Antonio 2011 Ann. Meeting, pp. 2433-2438.
Ryden, N. et al. (2006), "Fast simulated annealing inversion of surface waves on pavement using phase-velocity spectra," *Geophysics* 71(4), pp. R49-R58.
Sambridge, M.S. et al. (1991), "An Alternative Strategy for Non-Linear Inversion of Seismic Waveforms," *Geophysical Prospecting* 39, pp. 723-736.
Schoenberg, M. et al. (1989), "A calculus for finely layered anisotropic media," *Geophysics* 54, pp. 581-589.
Schuster, G.T. et al. (2010), "Theory of Multisource Crosstalk Reduction by Phase-Encoded Statics," SEG Denver 2010 Ann. Meeting, pp. 3110-3114.
Sears, T.J. et al. (2008), "Elastic full waveform inversion of multi-component OBC seismic data," *Geophysical Prospecting* 56, pp. 843-862.
Sheen, D-H. et al. (2006), "Time domain Gauss-Newton seismic waveform inversion in elastic media," Geophysics J. Int. 167, pp. 1373-1384.
Shen, P. et al. (2003), "Differential semblance velocity analysis by wave-equation migration," $73^{rd}$ Ann. Meeting of Society of Exploration Geophysicists, 4 pgs.
Sheng, J. et al. (2006), "Early arrival waveform tomography on near-surface refraction data," *Geophysics* 71, pp. U47-U57.
Sheriff, R.E.et al. (1982), "*Exploration Seismology*", pp. 134-135.
Shih, R-C. et al. (1996), "Iterative pre-stack depth migration with velocity analysis," *Terrestrial, Atmospheric & Oceanic Sciences* 7(2), pp. 149-158.
Shin, C. et al. (2001), "Waveform inversion using a logarithmic wavefield," *Geophysics* 49, pp. 592-606.
Simard, P.Y. et al. (1990), "Vector Field Restoration by the Method of Convex Projections," *Computer Vision, Graphics and Image Processing* 52, pp. 360-385.
Sirgue, L. (2004), "Efficient waveform inversion and imaging: A strategy for selecting temporal frequencies," *Geophysics* 69, pp. 231-248.
Soubaras, R. et al. (2007), "Velocity model building by semblance maximization of modulated-shot gathers," *Geophysics* 72(5), pp. U67-U73.
Spitz, S. (2008), "Simultaneous source separation: a prediction-subtraction approach," 78th Annual Int'l. Meeting, *SEG Expanded Abstracts*, pp. 2811-2815.
Stefani, J. (2007), "Acquisition using simultaneous sources," 69th Annual Conf. and Exh., *EAGE Extended Abstracts*, 5 pgs.
Symes, W.W. (2007), "Reverse time migration with optimal checkpointing," *Geophysics* 72(5), pp. P.SM213-SM221.
Symes, W.W. (2009), "Interface error analysis for numerical wave propagation," *Compu. Geosci.* 13, pp. 363-371.
Tang, Y. (2008), "Wave-equation Hessian by phase encoding," *SEG Expanded Abstracts* 27, pp. 2201-2205.
Tang, Y. (2009), "Target-oriented wave-equation least-squares migration/inversion with phase-encoded Hessian," *Geophysics* 74, pp. WCA95-WCA107.
Tang, Y. et al. (2010), "Preconditioning full waveform inversion with phase-encoded Hessian," *SEG Expanded Abstracts* 29, pp. 1034-1037.
Tarantola, A. (1986), "A strategy for nonlinear elastic inversion of seismic reflection data," *Geophysics* 51(10), pp. 1893-1903.
Tarantola, A. (1988), "Theoretical background for the inversion of seismic waveforms, including elasticity and attenuation," *Pure and Applied Geophysics* 128, pp. 365-399.
Tarantola, A. (2005), "Inverse Problem Theory and Methods for Model Parameter Estimation," *SIAM*, pp. 79.
Tarantola, A. (1984), "Inversion of seismic reflection data in the acoustic approximation," *Geophysics* 49, pp. 1259-1266.
Trantham, E.C. (1994), "Controlled-phase acquisition and processing," *SEG Expanded Abstracts* 13, pp. 890-894.
Tsvankin, I. (2001), "Seismic Signatures and Analysis of Reflection Data in Anisotropic Media," Elsevier Science, p. 8.
Valenciano, A.A. (2008), "Imaging by Wave-Equation Inversion," A Dissertation, Stanford University, 138 pgs.
Van Groenestijn, G.J.A. et al. (2009), "Estimating primaries by sparse inversion and application to near-offset reconstruction," *Geophyhsics* 74(3), pp. A23-A28.
Van Manen, D.J. (2005), "Making wave by time reversal," SEG International Exposition and $75^{th}$ Annual Meeting, *Expanded Abstracts*, pp. 1763-1766.
Verschuur, D.J. (2009), Target-oriented, least-squares imaging of blended data, 79th Annual Int'l. Meeting, *SEG Expanded Abstracts*, pp. 2889-2893.
Verschuur, D.J. et al. (1992), "Adaptive surface-related multiple elimination," *Geophysics* 57(9), pp. 1166-1177.
Verschuur, D.J. (1989), "Wavelet Estimation by Prestack Multiple Elimination," *SEG Expanded Abstracts* 8, pp. 1129-1132.
Versteeg, R. (1994), "The Marmousi experience: Velocity model determination on a synthetic complex data set," *The Leading Edge*, pp. 927-936.
Vigh, D. et al. (2008), "3D prestack plane-wave, full-waveform inversion," *Geophysics* 73(5), pp. VE135-VE144.
Wang, Y. (2007), "Multiple prediction through inversion: Theoretical advancements and real data application," Geophysics 72(2), pp. V33-V39.
Wang, K. et al. (2009), "Simultaneous full-waveform inversion for source wavelet and earth model," SEG Int'l. Expo. & Ann. Meeting, Expanded Abstracts, pp. 2537-2541.
Weglein, A.B. (2003), "Inverse scattering series and seismic exploration," *Inverse Problems* 19, pp. R27-R83.
Wong, M. et al. (2010), "Joint least-squares inversion of up- and down-going signal for ocean bottom data sets," *SEG Expanded Abstracts* 29, pp. 2752-2756.
Wu R-S. et al. (2006), "Directional illumination analysis using beamlet decomposition and propagation," *Geophysics* 71(4), pp. S147-S159.
Xia, J. et al. (2004), "Utilization of high-frequency Rayleigh waves in near-surface geophysics," *The Leading Edge*, pp. 753-759.
Xie, X. et al. (2002), "Extracting angle domain information from migrated wavefield," *SEG Expanded Abstracts*21, pp. 1360-1363.
Xie, X.-B. et al. (2006), "Wave-equation-based seismic illumination analysis," *Geophysics* 71(5), pp. S169-S177.
Yang, K. et al. (2000), "Quasi-Orthogonal Sequences for Code-Division Multiple-Access Systems," *IEEE Transactions on Information Theory* 46(3), pp. 982-993.
Yoon, K. et al. (2004), "Challenges in reverse-time migration," *SEG Expanded Abstracts* 23, pp. 1057-1060.
Young, J. et al. (2011), "An application of random projection to parameter estimation in partial differential equations," SIAM, 20 pgs.
Zhang, Y. (2005), "Delayed-shot 3D depth migration," *Geophysics* 70, pp. E21-E28.

(56) References Cited

OTHER PUBLICATIONS

Ziolkowski, A. (1991), "Why don't we measure seismic signatures?," *Geophysics* 56(2), pp. 190-201.
Abt, D.L. et al. (2010), "North American lithospheric discontinuity structured imaged by Ps and Sp receiver functions", *J. Geophys. Res.*, 24 pgs.
Akerberg, P., et al. (2008), "Simultaneous source separation by sparse radon transform," 78th SEG Annual International Meeting, *Expanded Abstracts*, pp. 2801-2805.
Aki, K. et al. (1980), "Quantitative Seismology: Theory and Methods vol. I—Chapter 7—Surface Waves in a Vertically Heterogenous Medium," W.H. Freeman and Co., pp. 259-318.
Aki, K. et al. (1980), "Quantitative Seismology: Theory and Methods vol. I," W.H. Freeman and Co., p. 173.
Aki et al. (1980), "Quantitative Seismology, Theory and Methods," Chapter 5.20, W.H. Freeman & Co., pp. 133-155.
Amundsen, L. (2001), "Elimination of free-surface related multiples without need of the source wavelet," *Geophysics* 60(1), pp. 327-341.
Anderson, J.E. et al. (2008), "Sources Near the Free-Surface Boundary: Pitfalls for Elastic Finite-Difference Seismic Simulation and Multi-Grid Waveform Inversion," $70^{th}$ EAGE Conf. & Exh., 4 pgs.
Barr, F.J. et al. (1989), "Attenuation of Water-Column Reverberations Using Pressure and Velocity Detectors in a Water-Bottom Cable," $59^{th}$ Annual SEG meeting, *Expanded Abstracts*, pp. 653-656.
Baumstein, A. et al. (2009), "Scaling of the Objective Function Gradient for Full Wavefield Inversion," SEG Houston 2009 Int'l. Expo and Annual Meeting, pp. 224-2247.
Beasley, C. (2008), "A new look at marine simultaneous sources," *The Leading Edge* 27(7), pp. 914-917.
Beasley, C. (2012), "A 3D simultaneous source field test processed using alternating projections: a new active separation method," *Geophsyical Prospecting* 60, pp. 591-601.
Beaty, K.S. et al. (2003), "Repeatability of multimode Rayleigh-wave dispersion studies," *Geophysics* 68(3), pp. 782-790.
Beaty, K.S. et al. (2002), "Simulated annealing inversion of multimode Rayleigh wave dispersion waves for geological structure," *Geophys. J. Int.* 151, pp. 622-631.
Becquey, M. et al. (2002), "Pseudo-Random Coded Simultaneous Vibroseismics," SEG Int'l. Exposition and 72th Annl. Mtg., 4 pgs.
Ben-Hadj-Ali, H. et al. (2009), "Three-dimensional frequency-domain full waveform inversion with phase encoding," *SEG Expanded Abstracts*, pp. 2288-2292.
Ben-Hadj-Ali, H. et al. (2011), "An efficient frequency-domain full waveform inversion method using simultaneous encoded sources," *Geophysics* 76(4), pp. R109-R124.
Benitez, D. et al. (2001), "The use of the Hilbert transform in ECG signal analysis," *Computers in Biology and Medicine* 31, pp. 399-406.
Berenger, J-P. (1994), "A Perfectly Matched Layer for the Absorption of Electromagnetic Waves," *J. of Computational Physics* 114, pp. 185-200.
Berkhout, A.J. (1987), "Applied Seismic Wave Theory," Elsevier Science Publishers, p. 142.
Berkhout, A.J. (1992), "Areal shot record technology," *Journal of Seismic Exploration* 1, pp. 251-264.
Berkhout, A.J. (2008), "Changing the mindset in seismic data acquisition," *The Leading Edge* 27(7), pp. 924-938.
Beylkin, G. (1985), "Imaging of discontinuities in the inverse scattring problem by inversion of a causal generalized Radon transform," *J. Math. Phys.* 26, pp. 99-108.
Biondi, B. (1992), "Velocity estimation by beam stack," *Geophysics* 57(8), pp. 1034-1047.
Bonomi, E. et al. (2006), "Wavefield Migration plus Monte Carlo Imaging of 3D Prestack Seismic Data," *Geophysical Prospecting* 54, pp. 505-514.
Boonyasiriwat, C. et al. (2010), 3D Multisource Full-Wavefoim using Dynamic Random Phase Encoding, SEG Denver 2010 Annual Meeting, pp. 1044-1049.
Boonyasiriwat, C. et al. (2010), 3D Multisource Full-Waveform using Dynamic Random Phase Encoding, SEG Denver 2010 Annual Meeting, pp. 3120-3124.
Bunks, C., et al. (1995), "Multiscale seismic waveform inversion," *Geophysics* 60, pp. 1457-1473.
Burstedde, G. et al. (2009), "Algorithmic strategies for full waveform inversion: 1D experiments," *Geophysics* 74(6), pp. WCC17-WCC46.
Chavent, G. et al. (1999), "An optimal true-amplitude least-squares prestack depth-migration operator," *Geophysics* 64(2), pp. 508-515.
Choi, Y. et al. (2011), "Application of encoded multisource waveform inversion to marine-streamer acquisition based on the global correlation," $73^{rd}$ EAGE Conference, *Abstract*, pp. F026.
Choi, Y et al. (2012), "Application of multi-source waveform inversion to marine stream data using the global correlation norm," *Geophysical Prospecting* 60, pp. 748-758.
Clapp, R.G. (2009), "Reverse time migration with random boundaries," SEG International Exposition and Meeting, *Expanded Abstracts*, pp. 2809-2813.
Dai, W. et al. (2010), "3D Multi-source Least-squares Reverse Time Migration," SEG Denver 2010 Annual Meeting, pp. 3120-3124.
Delprat-Jannuad, F. et al. (2005), "A fundamental limitation for the reconstruction of impedance profiles from seismic data," *Geophysics* 70(1), pp. R1-R14.
Dickens, T.A. et al. (2011), RTM angle gathers using Poynting vectors, *SEG Expanded Abstracts* 30, pp. 3109-3113.
Donerici, B. et al. (1005), "Improved FDTD Subgridding Algorithms via Digital Filtering and Domain Overriding," *IEEE Transactions on Antennas and Propagation* 53(9), pp. 2938-2951.
Downey, N. et al. (2011), "Random-Beam Full-Wavefield Inversion," 2011 San Antonio Annual Meeting, pp. 2423-2427.
Dunkin, J.W. et al. (1973), "Effect of Normal Moveout on a Seismic Pluse," *Geophysics* 38(4), pp. 635-642.
Dziewonski A. et al. (1981), "Preliminary Reference Earth Model", *Phys. Earth Planet. Int.* 25(4), pp. 297-356.
Ernst, F.E. et al. (2000), "Tomography of dispersive media," *J. Acoust. Soc. Am* 108(1), pp. 105-116.
Ernst, F.E. et al. (2002), "Removal of scattered guided waves from seismic data," *Geophysics* 67(4), pp. 1240-1248.
Esmersoy, C. (1990), "Inversion of P and SV waves from multicomponent offset vertical seismic profiles", *Geophysics* 55(1), pp. 39-50.
Etgen, J.T. et al. (2007), "Computational methods for large-scale 3D acoustic finite-difference modeling: A tutorial," *Geophysics* 72(5), pp. SM223-SM230.
Fallat, M.R. et al. (1999), "Geoacoustic inversion via local, global, and hybrid algorithms," *Journal of the Acoustical Society of America* 105, pp. 3219-3230.
Fichtner, A. et al. (2006), "The adjoint method in seismology I. Theory," *Physics of the Earth and Planetary Interiors* 157, pp. 86-104.
Forbriger, T. (2003), "Inversion of shallow-seismic wavefields: I. Wavefield transformation," *Geophys. J. Int.* 153, pp. 719-734.
Gao, H. et al. (2008), "Implementation of perfectly matched layers in an arbitrary geometrical boundary for leastic wave modeling," *Geophysics J. Int.* 174, pp. 1029-1036.
Gibson, B. et al. (1984), "Predictive deconvolution and the zero-phase source," *Geophysics* 49(4), pp. 379-397.
Godfrey, R. J. et al. (1998), "Imaging the Foiaven Ghost," *SEG Expanded Abstracts*, 4 pgs.
Griewank, A. (1992), "Achieving logarithmic growth of temporal and spatial complexity in reverse automatic differentiation," 1 *Optimization Methods and Software*, pp. 35-54.
Griewank, A. (2000), Evaluating Derivatives: Principles and Techniques of Algorithmic Differentiation, Society for Industrial and Applied Mathematics, 49 pgs.
Griewank, A. et al. (2000), "Algorithm 799: An implementation of checkpointing for the reverse or adjoint mode of computational differentiation," 26 *ACM Transactions on Mathematical Software*, pp. 19-45.
Griewank, A. et al. (1996), "Algorithm 755: A package for the automatic differentiation of algorithms written in C/C++," *ACM Transactions on Mathematical Software* 22(2), pp. 131-167.

(56) References Cited

OTHER PUBLICATIONS

Haber, E. et al. (2010), "An effective method for parameter estimation with PDE constraints with multiple right hand sides," Preprint—UBC http://www.math.ubc.ca/~haber/pubs/PdeOptStochV5.pdf.

Hampson, D.P. et al. (2005), "Simultaneous inversion of pre-stack seismic data," SEG 75$^{th}$ Annual Int'l. Meeting, *Expanded Abstracts*, pp. 1633-1637.

Heinkenschloss, M. (2008), :"Numerical Solution of Implicity Constrained Optimization Problems," CAAM Technical Report TR08-05, 25 pgs.

Helbig, K. (1994), "Foundations of Anisotropy for Exploration Seismics," Chapter 5, pp. 185-194.

Herrmann, F.J. (2010), "Randomized dimensionality reduction for full-waveform inversion," *EAGE abstract* G001, EAGE Barcelona meeting, 5 pgs.

Holschneider, J. et al. (2005), "Characterization of dispersive surface waves using continuous wavelet transforms," *Geophys. J. Int.* 163, pp. 463-478.

Hu, L.Z. et al. (1987), "Wave-field transformations of vertical seismic profiles," *Geophysics* 52, pp. 307-321.

Huang, Y. et al. (2012), "Multisource least-squares migration of marine streamer and land data with frequency-division encoding," *Geophysical Prospecting* 60, pp. 663-680.

Igel, H. et al. (1996), "Waveform inversion of marine reflection seismograms for P impedance and Poisson's ratio," *Geophys. J. Int.* 124, pp. 363-371.

Ikelle, L.T. (2007), "Coding and decoding: Seismic data modeling, acquisition, and processing," 77th Annual Int'l. Meeting, SEG Expanded Abstracts, pp. 66-70.

Jackson, D.R. et al. (1991), "Phase conjugation in underwater acoustics," *J. Acoust. Soc. Am.* 89(1), pp. 171-181.

Jing, X. et al. (2000), "Encoding multiple shot gathers in prestack migration," *SEG International Exposition and 70$^{th}$ Annual Meeting Expanded Abstracts*, pp. 786-789.

Kennett, B.L.N. (1991), "The removal of free surface interactions from three-component seismograms", *Geophys. J. Int.* 104, pp. 153-163.

Kennett, B.L.N. et al. (1988), "Subspace methods for large inverse problems with multiple parameter classes," *Geophysical J.* 94, pp. 237-247.

Krebs, J.R. (2008), "Fast Full-wavefield seismic inversion using encoded sources," *Geophysics* 74(6), pp. WCC177-WCC188.

Krohn, C.E. (1984), "Geophone ground coupling," *Geophysics* 49(6), pp. 722-731.

Kroode, F.T. et al. (2009), "Wave Equation Based Model Building and Imaging in Complex Settings," OTC 20215, 2009 Offshore Technology Conf., Houston, TX, May 4-7, 2009, 8 pgs.

Kulesh, M. et al. (2008), "Modeling of Wave Dispersion Using Continuous Wavelet Transforms II: Wavelet-based Frequency-velocity Analysis," *Pure Applied Geophysics* 165, pp. 255-270.

Lancaster, S. et al. (2000), "Fast-track 'colored' inversion," 70$^{th}$ SEG Ann. Meeting, *Expanded Abstracts*, pp. 1572-1575.

Lazaratos, S. et al. (2009), "Inversion of Pre-migration Spectral Shaping," 2009 SEG Houston Int'l. Expo. & Ann. Meeting, *Expanded Abstracts*, pp. 2383-2387.

Lazaratos, S. (2006), "Spectral Shaping Inversion for Elastic and Rock Property Estimation," *Research Disclosure*, Issue 511, pp. 1453-1459.

Lazaratos, S. et al. (2011), "Improving the convergence rate of full wavefield inversion using spectral shaping," *SEG Expanded Abstracts* 30, pp. 2428-2432.

Lecomte, I. (2008), "Resolution and illumination analyses in PSDM: A ray-based approach," The Leading Edge, pp. 650-663.

Lee, S. et al. (2010), "Subsurface parameter estimation in full wavefield inversion and reverse time migration," SEG Denver 2010 Annual Meeting, pp. 1065-1069.

Levanon, N. (1988), "Radar Principles," Chpt. 1, John Whiley & Sons, New York, pp. 1-18.

Liao, Q. et al. (1995), "2.5D full-wavefield viscoacoustic inversion," *Geophysical Prospecting* 43, pp. 1043-1059.

Liu, F. et al. (2007), "Reverse-time migration using one-way wavefield imaging condition," SEG Expanded Abstracts 26, pp. 2170-2174.

Liu, F. et al. (2011), "An effective imaging condition for reverse-time migration using wavefield decomposition," *Geophysics* 76, pp. S29-S39.

Maharramov, M. et al. (2007), "Localized image-difference wave-equation tomography," SEG Annual Meeting, *Expanded Abstracts*, pp. 3009-3013.

Malmedy, V. et al. (2009), "Approximating Hessians in unconstrained optimization arising from discretized problems," *Computational Optimization and Applications*, pp. 1-16.

Marcinkovich, C. et al. (2003), "On the implementation of perfectly matched layers in a three-dimensional fourth-order velocity-stress finite difference scheme," *J of Geophysical Research* 108(B5), 2276.

Martin, G.S. et al. (2006), "Marmousi2: An elastic upgrade for Marmousi," *The Leading Edge*, pp. 156-166.

Meier, M.A. et al. (2009), "Converted wave resolution," Geophysics, 74(2):doi:10.1190/1.3074303, pp. Q1-Q16.

Moghaddam, P.P. et al. (2010), "Randomized full-waveform inversion: a dimenstionality-reduction approach," 80$^{th}$ SEG Ann. Meeting, *Expanded Abstracts*, pp. 977-982.

Mora, P. (1987), "Nonlinear two-dimensional elastic inversion of multi-offset seismic data," *Geophysics* 52, pp. 1211-1228.

\* cited by examiner

Example LU factorizations (from Wikipedia)

$$\begin{bmatrix} a_{11} & a_{12} & a_{13} \\ a_{21} & a_{22} & a_{23} \\ a_{31} & a_{32} & a_{33} \end{bmatrix} = \begin{bmatrix} l_{11} & 0 & 0 \\ l_{21} & l_{22} & 0 \\ l_{31} & l_{32} & l_{33} \end{bmatrix} \begin{bmatrix} u_{11} & u_{12} & u_{13} \\ 0 & u_{22} & u_{23} \\ 0 & 0 & u_{33} \end{bmatrix}.$$

$$\begin{bmatrix} 4 & 3 \\ 6 & 3 \end{bmatrix} = \begin{bmatrix} 1 & 0 \\ 1.5 & 1 \end{bmatrix} \begin{bmatrix} 4 & 3 \\ 0 & -1.5 \end{bmatrix}.$$

*FIG. 1*
*(Prior Art)*

METHOD FOR FAST LINE SEARCH IN FREQUENCY DOMAIN FWI

CROSS-REFERENCE TO RELATED APPLICATION

This application claims the benefit of U.S. Provisional Patent Application 61/977,416, filed Apr. 9, 2014, entitled METHOD FOR FAST LINE SEARCH IN FREQUENCY DOMAIN FWI, the entirety of which is incorporated by reference herein.

FIELD OF THE INVENTION

This disclosure relates generally to the field of geophysical prospecting for, or production of, hydrocarbons and, more particularly, to seismic data processing. Specifically, the disclosure relates to a novel method for performing a line search to determine a model update in inversion of seismic data.

BACKGROUND OF THE INVENTION

The present invention is a method for rapidly computing the change in a modeled wavefield (i.e. pressure or displacement) given a small change in the model being considered. The method is applicable to forward modeling being performed in the frequency domain, wherein the wave equation has been formulated to propagate a wave at a single temporal frequency. As shown below, the frequency domain wave equation, known as the Helmholtz equation, becomes a set of linear equations after discretization in space.

The set of linear equations is typically solved in one of two ways, either via an iterative process or by factorizing the matrix representing the linear equations. (See, for example, reference 2—Shen Wang et al. (2010), which is incorporated herein by reference in all jurisdictions that allow it.) The invention to be described herein is most advantageous when applied in conjunction with the factorization method, which makes it possible to solve for the wavefield corresponding to an arbitrary source location very quickly once the factorization has been performed and the factors stored.

The primary disadvantage of the factorization method is the large amount of memory and long CPU time required to perform the matrix factorization. The elements of the matrix depend upon the model parameters, such as P-wave velocity $V_p$ and the P-wave quality factor $Q_p$. When these model parameters are modified, the matrix must be factorized again. Therefore, in an iterative process such as full wavefield inversion ("FWI"), where the model is changed many times, the computational cost is increased by a large amount due to these re-factorizations. Seismic data inversion is used for exploring for hydrocarbon reservoirs and for developing and producing them.

SUMMARY OF THE INVENTION

The present invention takes advantage of two key points: 1) the model parameter changes in a line search are normally restricted to be very small, amounting to only a few percent of the maximum parameter value, and 2) the factors of the matrix corresponding to the original model values are stored and, as mentioned above, can be used to quickly solve for the wavefield given any source function.

A line search is a procedure commonly used in inversion algorithms to determine the location of a minimum of a function that is being optimized. For FWI, given a direction g in model-parameter space in which to search, the goal of the line search is to determine how far to move, by changing the model parameters, in the specified direction. Thus, it is a one-dimensional optimization problem, since the search takes place on a line within model-parameter space. One can write $m_\alpha = m_0 + \alpha g$, where $m_0$ is the initial model; the goal of the line search is to select $\alpha$ to produce a new model $m_\alpha$ that, when used to forward model seismic data, provides the best fit to the observed data.

Various line-search methods have been investigated; see, for example, reference 1, Nocedal and Wright (2006), which is incorporated herein in all jurisdictions that allow it. The line search method used as an example in the present document is an effective, technique based on evaluating the objective function for a number of different distances along the descent direction (defined by parameter $\alpha$ in the prior equation), and then selecting the $\alpha$ value that gives the minimum among those points. The present invention is not restricted, however, to this one example of a line-search technique.

An object of the invention is to replace repeated, slow, wavefield evaluations that must be performed when an FWI algorithm searches through model parameter space to find an optimal match to measured data, with much faster wavefield evaluations that rely upon the two key points mentioned in the previous paragraph. In a typical iterative inversion process, an initial model parameter guess is changed by moving the parameters in a descent direction, i.e. a direction that decreases the difference between data predicted by the model and the measured data one is trying to match. This direction is usually selected to be the negative of the gradient in model parameter space of the misfit function, or some modified version of it.

At each new location in model space, the misfit has to be computed to verify that it has been reduced. (Even though the model is being adjusted in the opposite direction of the gradient, the misfit may not be reduced if the step size is too large; in addition, one needs to do so to approximately determine when the point of minimum misfit has been reached for the given iteration.) This is usually done simply by performing a complete new wavefield computation for comparison with the measured data. This is typically a computationally expensive step.

In frequency domain FWI as implemented via a matrix factorization approach, the new wavefield computation makes it necessary to factorize the Helmholtz matrix again, since the model parameters and therefore the matrix entries have changed. Particularly for three-dimensional (3D) problems, the factorization is by far the most computationally expensive portion of the algorithm. In a typical implementation one might perform up to five line-search steps for each iteration in the inversion, each step differing by the step size. Just by way of example, one might select an initial step size $\alpha$, then increase the step size by integer multiples, i.e. $2\alpha$, $3\alpha$, etc., until the objective function begins to increase. Since one matrix factorization must be performed at the beginning of each iteration, if we take an average of 2.5 factorizations for each line search, a total of 3.5 factorizations will be needed per iteration.

The invention allows the user to dispense with the extra factorizations required for the line search, making use of a fast, perturbation-based approach to update the wavefield. This is made possible by the two keys mentioned above, that the model changes are small during the line search, and that the matrix factors are stored in computer memory. The method will be explained in detail in the detailed description section.

Given that the matrix factorization dominates the cost of the FD FWI inversion algorithm, the method given by the invention could be expected to be roughly 3.5 times as fast as that of a naïve implementation, since 3.5 factorizations are replaced by one. The invented algorithm requires only a few matrix-vector multiplications, which are of negligible cost compared to the matrix factorization.

In one embodiment, the invention is a method for inverting measured seismic data in frequency domain to infer a model of a physical property representative of a subsurface region, comprising: in iterative inversion of the measured data performed using a computer to estimate the model, after an objective function has been computed measuring difference between model-simulated data and the measured data, and after a gradient of the objective function with respect to parameters of the model has been computed to establish a search direction for a model update, then performing a line search along the search direction to determine the model update, said line search comprising:

(a) computing a model update by perturbing a current model in the search direction, and then estimating a corresponding perturbation in the model-simulated data using perturbation theory;

(b) re-computing the objective function using the perturbed model-simulated data;

(c) repeating (a)-(c) a plurality of times with different model perturbations, and selecting the model perturbation that results in a minimum objective function.

In a preferred embodiment, the model-simulated data are generated by solving the Helmholtz equation by factoring the matrix containing the dependence on model parameters into lower and upper triangular matrices, and then solving by forward substitution followed by backward substitution.

BRIEF DESCRIPTION OF THE DRAWINGS

The present invention and its advantages will be better understood by referring to the following detailed description and the attached drawings in which:

FIG. 1 shows two examples of factoring a matrix into lower- and upper-triangular matrices;

Figure 2:
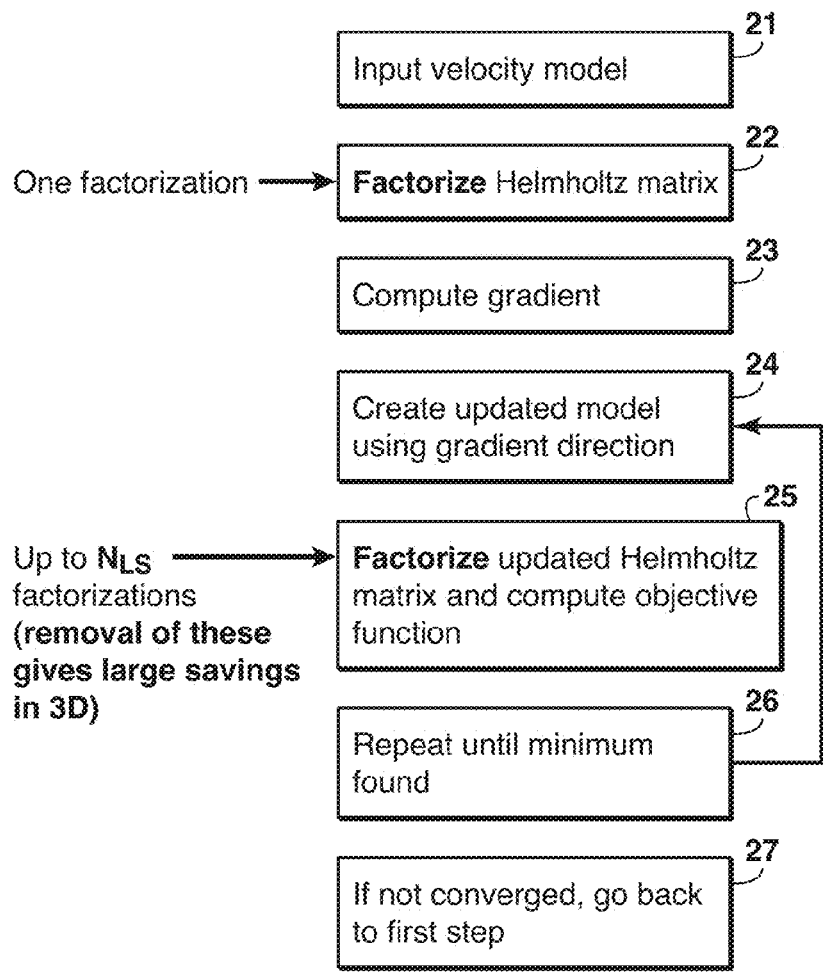
FIG. 2 is a flow chart showing basic steps in a conventional frequency-domain FWI work flow.

The invention will be described in connection with example embodiments. However, to the extent that the following detailed description is specific to a particular embodiment or a particular use of the invention, this is intended to be illustrative only, and is not to be construed as limiting the scope of the invention. On the contrary, it is intended to cover all alternatives, modifications and equivalents that may be included within the scope of the invention, as defined by the appended claims.

DETAILED DESCRIPTION OF EXAMPLE EMBODIMENTS

For an acoustic medium, pressure is computed in the frequency domain by solving the Helmholtz equation, $$\nabla^2 u + k^2 u = -s(\omega)\delta(\vec{r} - \vec{r}_0) \qquad (1)$$

where u is the pressure (i.e., the seismic data, transformed to frequency domain using, for example, the Fourier transform), $s(\omega)$ is the source amplitude and phase as a function of frequency $\omega = 2\pi f$, k is the wavenumber ($=\omega/c$), and $r_0$ is the source location. The quantity c is the phase velocity, which is related to the P-wave velocity $V_P$ and the attenuation Q by:

$$\frac{1}{c} = \frac{1}{V_p}\left[1 - \frac{1}{\pi Q}\log(\omega/\omega_0) + \frac{i}{2Q}\right].$$

Equation (1) is implemented numerically by discretizing the problem onto a spatial grid; the Laplacian $\nabla^2$ is represented by a finite-difference approximation (see, for example, reference 2). Writing the pressure u and source term as vectors then leads to the following system of linear equations, which uses a finite-difference method to represent Eqn. (1):

$$Au = -s; \qquad (2)$$

with a spatial grid of dimensions (nx,ny,nz), the vectors have lengths N=(nx*ny*nz), and the matrix A has dimension N×N. The matrix A may be called the Helmholtz matrix, and its elements depend on a velocity model, a Q model, a density model, and other parameters required to represent the physics of the problem. Clearly, for 3D problems the matrix has very large dimensions, but is sparse.

Solving the system (2) for the pressure, given a source, a frequency $\omega$ ($=2\pi f$) and velocity model c(r), can be accomplished, as stated above, either by using an iterative method such as the Generalized Minimum Residual ("GMRES"— see reference 3) or one of several other such iterative methods that will be known to those skilled in numerical linear algebra, or by representing the matrix A in a different way such that the solution becomes simpler. A standard method of performing the second method, i.e. transforming the matrix into a simpler representation, is to factor the matrix A into lower- and upper-triangular matrices (L and U in Eqn. 3), as shown for two small matrices in FIG. 1 (Example from Wikipedia). Well-known algorithms for this procedure, which is known as LU decomposition or LU factorization, exist and will be known to those skilled in the art of numerical linear algebra; see for example reference 4, which is incorporated herein by reference in all jurisdictions that allow it.

It is well known that with the linear system written as $$LUu = -s, \qquad (3)$$

it can be solved by the fast processes of forward substitution followed by backward substitution. First, we write Uu=d and numerically solve the system Ld=−s, which is simple to solve quickly for d because of the lower-triangular nature of L. Then, the system Uu=d can be solved rapidly for u, again due to the triangular nature of U. If a solution is needed for a new source function s, this process can be repeated to quickly produce the new solution, as long as the factors L and U are retained in computer memory.

Note that the high efficiency of solving for u with new source functions (which can refer to changed source location, magnitude, or phase, or any combination of these parameters) depends critically on the constancy of the factors L and U. That is, the matrix A cannot have changed, so the model parameters (here, the sound speed c(r)), must not be varied.

The present invention involves a method by which the wave field u can be computed efficiently even in cases where the model parameters, and therefore the factors L and U, have changed. We consider the case where the model parameters are modified by a small amount, and show how a perturbation method can be used to modify the wave field u to the new value it would have with the new model parameters. The present invention includes the application of this technique to the line-search algorithm used to find the model parameters that yield the minimum value of the objective function in frequency domain FWI.

This perturbation method may be derived as follows. Consider a modification to the linear system of equation 2. The matrix A is perturbed by the addition of a matrix $\delta A$ which is in some sense small compared to A. Since the source is unchanged, the wave field will be modified by a presumably small amount $\delta u$, which satisfies the equation $$(A+\delta A)(u+\delta u)=-s, \quad (4)$$

or $$Au+A\delta u+\delta Au+\delta A\delta u=-s. \quad (5)$$

In this application, we know $\delta A$, and wish to solve for the update to the wave field, $\delta u$. The simplest approximation for $\delta u$ is derived by ignoring the $2^{nd}$-order term $(\delta A, \delta u)$, giving $$A\delta u \approx -(\delta A)u. \quad (6)$$

Since we have retained the factors L and U of A, the preceding equation can be solved efficiently for $\delta u$ by using the forward/back-substitution algorithm outlined above, with an effective source term given by $$s_{eff}=-(\delta A)u. \quad (7)$$

If necessary, a more accurate solution for $\delta u$ can be obtained by a recursive procedure as follows. Rewrite the perturbed equation 5 as follows, solving symbolically for $\delta u$:

$$\delta u=-(A+\delta A)^{-1}(\delta A)u. \quad (8)$$

We may use the following Taylor series expansion, assuming, as will be true in the cases considered here, that $\delta A$ is small enough such that it converges:

$$(A+\delta A)^{-1} = A^{-1}\sum_{k=0}^{\infty}\left(-\frac{\delta A}{A}\right)^k. \quad (9)$$

Using this expansion in equation 8 and denoting the approximation for $\delta u$ obtained by truncating the series in equation 9 to n terms by $\delta u_n$, we can show that $\delta u$ satisfies the recursion relation $$(\delta u)_{n+1}=(\delta u)_n - A^{-1}(\delta A)[(\delta u)_n-(\delta u)_{n-1}], \quad (10)$$

where the recursion is initialized by $(\delta u_0=u, \delta u_{-1}=0)$. (This is done by subtracting the equations for $\delta u_{n+1}$ and $\delta u_n$.)

It can be shown that the series in equation 9 converges if $$\frac{|\delta A|}{|A|} < 1,$$

where the symbol |•| symbolizes a matrix norm. In addition, it can be shown that (see reference 7) the relative difference between the solutions x and x' of Ax=b and (A+D)x'=b can be bounded by $$\frac{|x'-x|}{|x|} \leq \frac{\kappa\frac{|D|}{|A|}}{1-\kappa\frac{|D|}{|A|}},$$

where $\kappa$ is the condition number of the matrix A. This shows that the error in solution obtained by using the perturbation method is bounded.

The present invention involves the application of the preceding analysis to the improvement of the speed of frequency domain FWI ("FD FWI"), by reducing the number of expensive matrix factorizations that need to be performed. To further explain the invention, we give the basic steps required for conventional FD FWI, i.e. performed without the improvement of the present invention. These may be summarized as follows, where the reference numbers 21-27 refer to the flow chart of FIG. 2:

1. Create an initial parameter model 21.

2. Select an objective function whose minimization will lead the algorithm to provide a good estimate of the correct model parameters, given the measured data (pressure, displacement, etc.). Compute the objective function, which requires factoring the Helmholtz matrix (22).

3. Using the current estimated model and measured data, compute a search direction in model parameter space that, when the model parameter(s) are changed in that direction, will reduce the value of the objective function, thus yielding a model that more closely predicts the measured data. This direction is usually the negative of the gradient of the misfit function (23), or a modified version of it.

4. Change the model parameters (24) by amounts proportional to the search direction. In other words, the model parameters are changed by adding increment(s) to them that are given by a scaled version of the search direction vector (as stated above, the search direction vector is typically the negative of the gradient vector, so that the objective function will be reduced). The objective function is then computed for each changed model (25), i.e. for each selected step size. Each computation of the objective function requires a new factoring of the revised Helmholtz matrix. Stop when the minimum value is found (26). Set this new model to be the current model estimate.

5. If the objective function has reached a "small enough" value or if a preset maximum number of iterations has been performed, stop (27); otherwise, repeat steps 3-5.

These steps are illustrated in the flow chart shown in FIG. 2. In order to make the explanation more precise, it is useful to review some of the mathematics of the algorithm. A common selection for the objective (or misfit) function is the $L_2$ norm, given by $$E = \frac{1}{2}\sum_{\omega,x_s,x_r}|u(\omega,x_s,x_r,m)-d(\omega,x_s,x_r)|^2, \quad (11)$$

where u is the modeled data, d is the measured (field) data, and $x_s$ and $x_r$ are source and receiver coordinates, respectively. Note that other norms can be used, with no effect on the utility of the invention. Given an initial model $m_0$ (step 1 above; $m_0$ can refer to a single parameter like velocity, or to multiple parameters), the model is updated by searching using the gradient $\nabla_m E$:

$$m_1 = m_0 - \alpha \nabla_m E, \quad (12)$$

where $\alpha$ is called the step length. This is step 4 above; one typically selects a few different values for $\alpha$, thus obtaining different estimates for the updated model, and selects the step length/model estimate that yields the smallest value for the objective function E. In this manner, an adjustment, up or down or possibly stay the same, is made to every parameter of the model. Using velocity as an example, the velocity in every spatial cell in the computational grid is adjusted to reduce the objective function. The process is repeated (step 5) until E is deemed small enough.

As mentioned in step 4, the objective function E must be recomputed every time the model is changed. From equation 11, it is clear that this involves computing the modeled wavefield u, using the new model parameters. As noted before, this means that in the considered method for solving the linear equations 2, the Helmholtz matrix must be factorized again. This leads to a very significant computational time, since factorization is the costliest part of FD FWI. In a typical FWI line search, as shown in FIG. 2, the user selects some number NLS of different values for the step size $\alpha$ to be tested, leading to NLS factorizations of the Helmholtz matrix. The number can vary, but a typical value for NLS is five.

Figure 3:
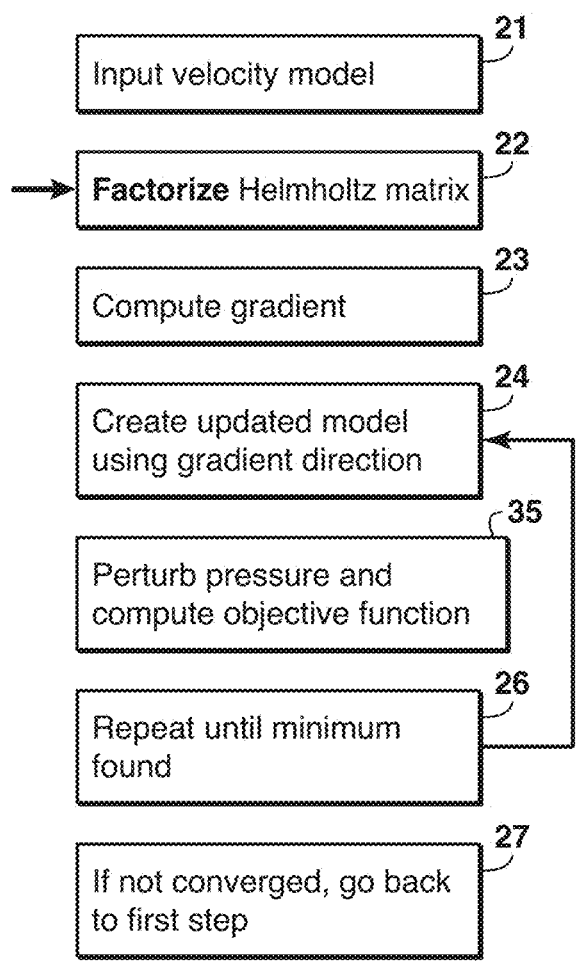
FIG. 3 is a flow chart showing how the present inventive method alters the method of FIG. 2.

A novel step in the present invention is to apply perturbation theory, as explained above, to updating the computed wavefield u to avoid the costly matrix re-factorizations required by the usual line search algorithm. As shown in FIG. 3, in comparison with FIG. 2, the cost of the line search step is reduced from that of M factorizations to that of p*M matrix multiples, where M is the number of steps taken, and p is the order of perturbation theory used. For example, if p=2, the iterative equation (10) is applied twice, giving the 2nd-order estimate $\delta u_2$. The perturbatively estimated value is then added to the original wavefield solution to obtain the estimated solution with the updated model. The present inventive method is illustrated by the flowchart of FIG. 3, in which all steps are identical to the corresponding steps in FIG. 2 except for step 35 where the perturbation approach of the present invention replaces step 25 and its need to factor the updated Helmholtz matrix and compute the altered objective function for each step of the line search.

Changsoo Shin, et al. describe using a perturbed form of a matrix equation to perform linearized direct inversion, i.e. without iteration. ("Frequency-domain homotopy inversion using the perturbation theory," Abstract, 2011 SEG Meeting; "Application of frequency-domain homotopy inversion to real data," Abstract, 2013 SEG Meeting.) The success of non-iterative inversion depends to a great extent on the accuracy of the starting model. In contrast to the present inventive method, this approach utilizes the difference in wavefields (measured-predicted) to compute a linearized update in a model parameter, whereas the present invention computes an update in the wavefield.

Example Application

Figure 4:
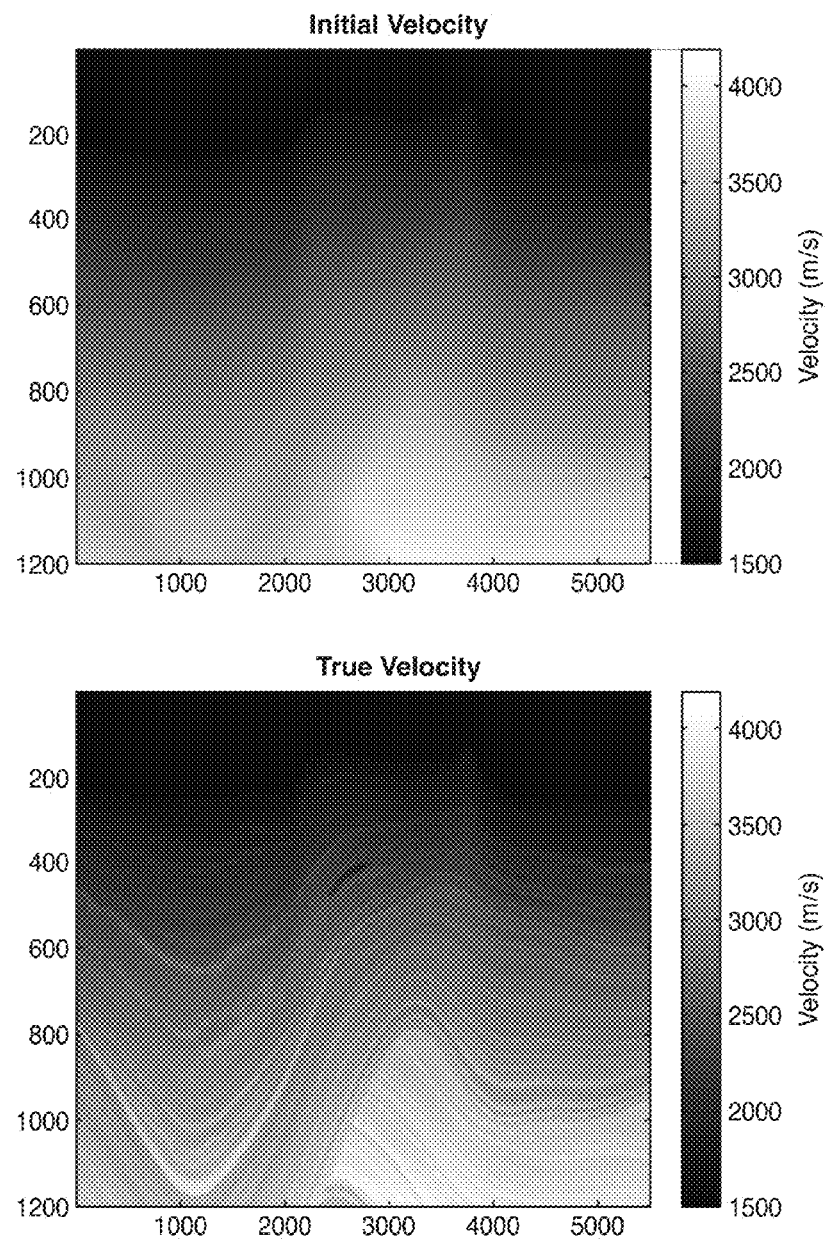
FIG. 4 displays initial and true models for a test example that compares the present inventive method (FIG. 3) to the traditional method (FIG. 2) to invert synthetic seismic data for $V_P$.

As a test example for the present invention, a frequency-domain inversion was performed using a simple 2D velocity model based upon the SEAM model created by the Society of Exploration Geophysicists (see, for example, reference 8). For this example, the measured data are synthetic data generated using the SEAM model which therefore can be called the true model. FIG. 4 shows the true model of velocity as well as the initial model used to start the iterative inversion process. The horizontal and vertical axes represent horizontal and vertical subsurface spatial location in grid cells, with each grid cell measuring 6×6 m. The inversion is performed using five frequencies (3, 4.2, 6, 8.4 and 12 Hz) with 10 iterations at each frequency.

Figure 5:
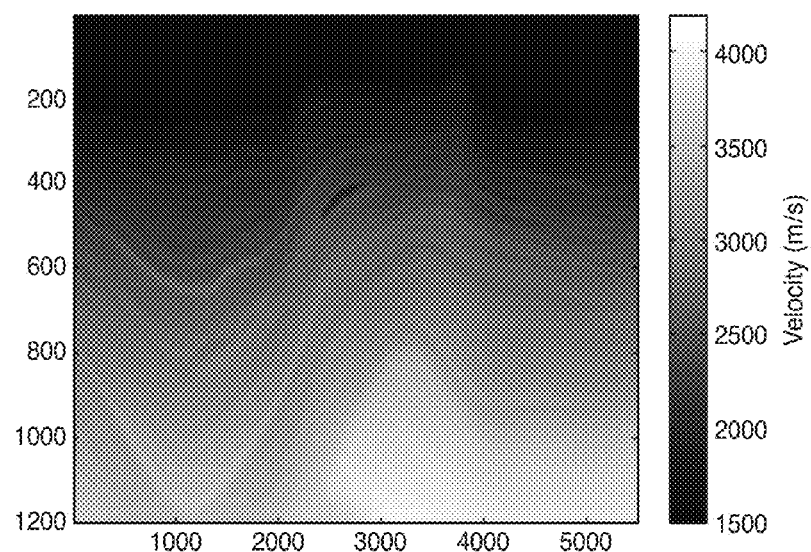
FIG. 5 displays the inverted $V_P$ model obtained using re-factorization at each line-search step, i.e. the method of FIG. 2.

FIG. 5 shows the inverted values for $V_P$. Note that the model contains absorption, i. e. there is a non-infinite Q model, but for simplicity it was set to its true value and not inverted for; however, it is included in the wave propagation via its contribution to the Helmholtz matrix A for the problem. In this case the typical inversion algorithm outlined in FIG. 2 is used, wherein the line search is performed by re-factorizing the matrix at each step.

Figure 6:
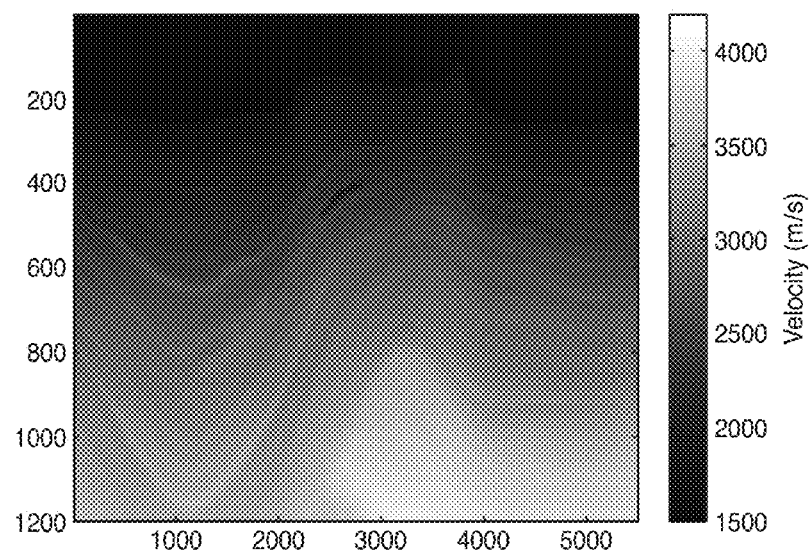
FIG. 6 displays the inverted $V_P$ model obtained using the present invention's perturbation method at each line-search step, i.e. the method of FIG. 3.
Figure 7:
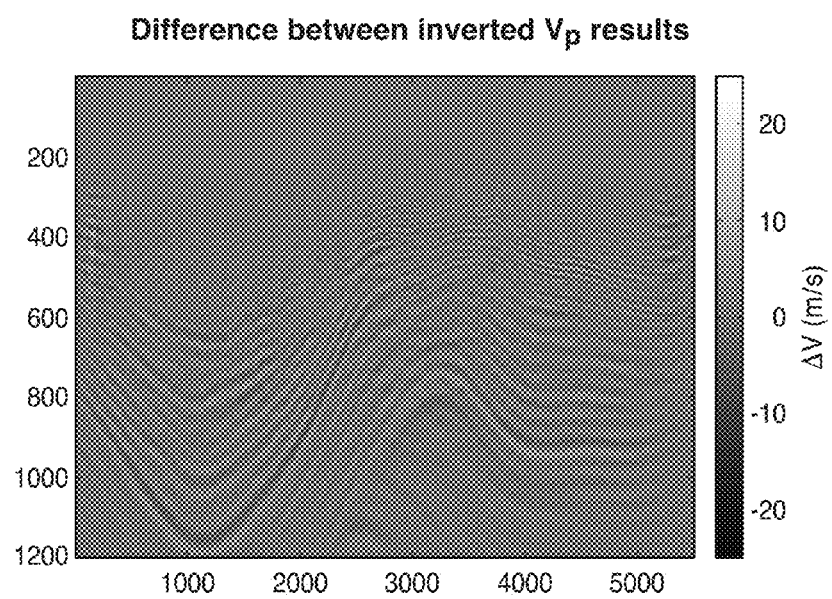
FIG. 7 displays the difference between the inverted $V_P$ results of FIGS. 5 and 6.
Figure 8:
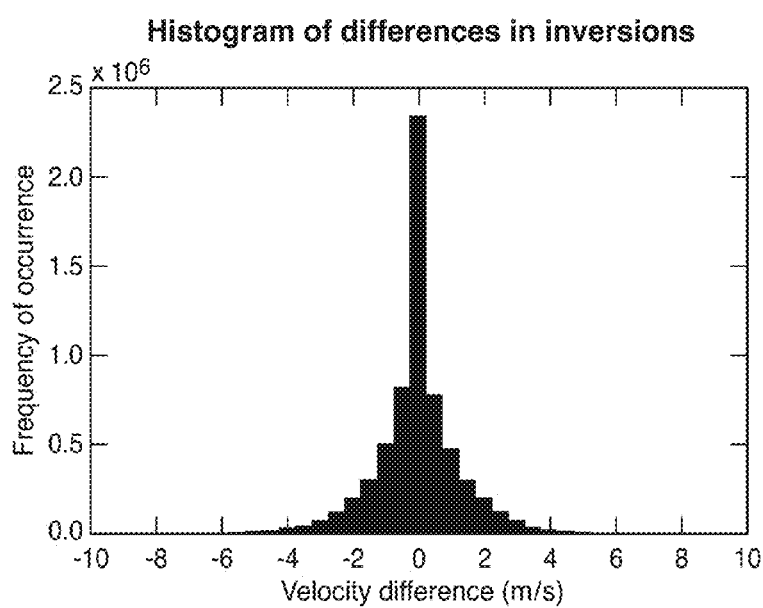
FIG. 8 displays the differences shown in FIG. 7 as a histogram.
Figure 9:
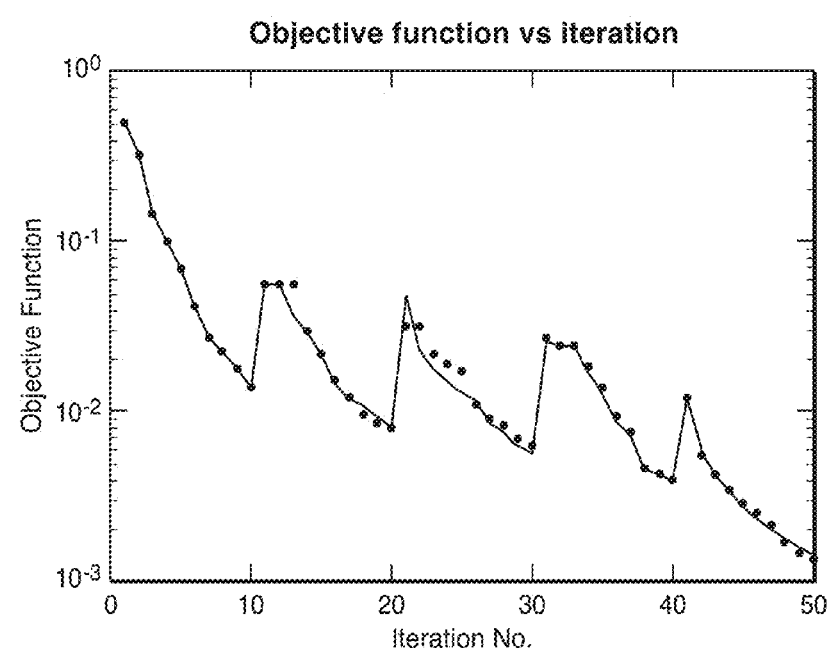
FIG. 9 shows how the value of the objective function changes as the inversion iterations progress from 1 to 50 in the test example.

FIG. 6 shows the result obtained using the perturbation technique of the present invention, and FIG. 7 shows the difference between the two results. FIG. 8 is a histogram of these differences. The differences are clearly very small, almost entirely less than 5 m/s for most of the model, rising to about 15 m/s in only a few locations. FIG. 9 illustrates the change in L2 misfit function as a function of iteration number (the discontinuities at frequency changes are to be expected, due to changing normalization at different frequencies). The black curve represents the full computation (method of FIG. 2), and the filled black circles represent the perturbation method of the present invention (method of FIG. 3). The two curves track very closely, showing that the perturbation method follows the exact solution very well.

The perturbation technique of the present invention is not limited to performing the line search in a data inversion operation. There can be other reasons than a line search to need the updated wavefield after changing the model. For example, it might be desirable to check the sensitivity of some result to uncertainty in the model parameters.

The foregoing description is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined by the appended claims. All practical applications of the present inventive method are performed using a computer, programmed in accordance with the disclosures herein.

REFERENCES

1. J. Nocedal and S. Wright, *Numerical Optimization*, Springer, Chapter 3, 30-63 (2006).
2. Shen Wang, Maarten V. de Hoop, Jianlin Xia, "Acoustic inverse scattering via Helmholtz operator factorization and optimization," *Journal of Computational Physics* 229, 8445-8462 (2010).
3. Y. Saad and M. H. Schultz, "GMRES: A generalized minimal residual algorithm for solving nonsymmetric linear systems," *SIAM J. Sci. Stat. Comput.* 7, 856-869 (1986).
4. Nicholas J. Higham, *Accuracy and Stability of Numerical Algorithms*, Philadelphia: Society for Industrial and Applied Mathematics, Chapter 9, 169-199 (1996).

5. G. W. Stewart and Ji-Guang Sun, *Matrix Perturbation Theory*, Academic Press Inc., San Diego, Chapter 2, 125 (1990).
6. Fehler, M., and K. Lamer, SEG advanced modeling (SEAM), "Phase I first year update," *The Leading Edge* 27, 1006-1007 (2008).
7. Changsoo Shin, et al.: "Frequency-domain homotopy inversion using the perturbation theory," Abstract, 2011 SEG Meeting (2011); "Application of frequency-domain homotopy inversion to real data," Abstract, 2013 SEG Meeting. (2013).

The invention claimed is:

1. A method for inverting measured seismic data in frequency domain to infer a model of a physical property representative of a subsurface region, comprising:
in iterative inversion of the measured data performed using a computer to estimate the model, after an objective function has been computed measuring difference between model-simulated data u and the measured data, and after a gradient of the objective function with respect to parameters of the model has been computed to establish a search direction for a model update, then performing a line search along the search direction to determine the model update, said line search including,
(a) computing a model update by perturbing a current model in the search direction, and then estimating a corresponding perturbation in the model-simulated data u using perturbation theory that includes solving a frequency-domain wave propagation equation written in the form $Au=-s$, where s is a vector representing frequency-dependent source amplitude and phase, respectively, and A is a matrix that depends on the model,
(b) re-computing the objective function using the perturbed model-simulated data, and
(c) repeating (a)-(c) a plurality of times with different model perturbations, and selecting the model perturbation that results in a minimum objective function;
generating an updated physical property model with the model perturbation that results in the minimum objective function; and
prospecting for and producing hydrocarbons in a subsurface region, wherein a hydrocarbon exploration decision is based on the updated physical property model.

2. The method of claim 1, wherein the frequency-domain wave propagation equation is the Helmholtz equation.

3. The method of claim 1, wherein the matrix A is factored into lower and upper triangular matrices, and the wave propagation equation is solved by forward substitution followed by backward substitution.

4. The method of claim 3, wherein the perturbed model-simulated data is estimated in (a) without refactoring or recomputing A.

5. The method of claim 1, wherein the inversion is full wavefield inversion.

6. The method of claim 1, wherein the physical property is at least one of P-wave velocity $V_p$, shear wave velocity $V_s$, P-wave quality factor $Q_p$, S-wave quality factor $Q_s$, any anisotropy parameter, and density.

7. The method of claim 1, wherein the iterative inversion is performed on the measured data one frequency component at a time.

8. The method of claim 1, further comprising updating the model with the perturbation from (c) that minimizes the objective function, then using that updated model to generate a new set of model-simulated data, and using that data to compute a new objective function, then determine a search direction by computing the gradient of the new objective function, then repeating (a)-(c).

* * * * *